(12) United States Patent
Emami

(10) Patent No.: US 10,204,806 B2
(45) Date of Patent: Feb. 12, 2019

(54) MODULAR HEATER

(76) Inventor: Arsalan Emami, Aliso Viejo, CA (US)

( * ) Notice: Subject to any disclaimer, the term of this patent is extended or adjusted under 35 U.S.C. 154(b) by 1061 days.

(21) Appl. No.: 13/602,346

(22) Filed: Sep. 4, 2012

(65) Prior Publication Data

US 2013/0058372 A1 Mar. 7, 2013

Related U.S. Application Data

(60) Provisional application No. 61/573,451, filed on Sep. 6, 2011, provisional application No. 61/573,450, filed on Sep. 6, 2011.

(51) Int. Cl.
*H05B 3/62* (2006.01)
*H01L 21/67* (2006.01)

(52) U.S. Cl.
CPC .............. *H01L 21/67109* (2013.01)

(58) Field of Classification Search
USPC ........ 373/117, 109, 111, 118, 119, 128, 130, 373/137, 150; 219/638, 635, 411, 385, 219/402, 389, 390, 391, 538, 393, 395, 219/396, 403, 406, 408; 392/416, 407, 392/418; 118/724, 725; 438/758, 778, 438/781
See application file for complete search history.

(56) References Cited

U.S. PATENT DOCUMENTS

| | | | | |
|---|---|---|---|---|
| 3,973,934 A * | 8/1976 | Nierenberg | ........................ | 96/7 |
| 5,813,851 A * | 9/1998 | Nakao | ............... | 432/6 |
| 5,997,049 A * | 12/1999 | Kingsford et al. | ........... | 285/331 |
| 7,135,659 B2 * | 11/2006 | Ejima | .......................... | 219/497 |
| 2002/0081250 A1 | 6/2002 | Lord | | |
| 2002/0088610 A1* | 7/2002 | Suenaga et al. | .............. | 165/135 |
| 2008/0205864 A1* | 8/2008 | Kobayashi et al. | .......... | 392/416 |
| 2009/0035948 A1 | 2/2009 | Miyata | | |
| 2009/0293784 A1* | 12/2009 | Lindeman et al. | ........... | 110/323 |

FOREIGN PATENT DOCUMENTS

JP 2002151237 5/2002

OTHER PUBLICATIONS

PCT preliminary report on patentability—PCT/IB2012/054575—dated Mar. 12, 2014.

* cited by examiner

*Primary Examiner* — Hung D Nguyen
(74) *Attorney, Agent, or Firm* — Ricky Lam

(57) ABSTRACT

A modular heater includes multiple heater modules. The heater modules can include mating features, such as a tongue and groove seal, and/or soft seal, to prevent radiation, thermal convection and thermal conduction leakage. The heater module can also include heater elements, together with supports and expansion room for the heater elements.

2 Claims, 16 Drawing Sheets

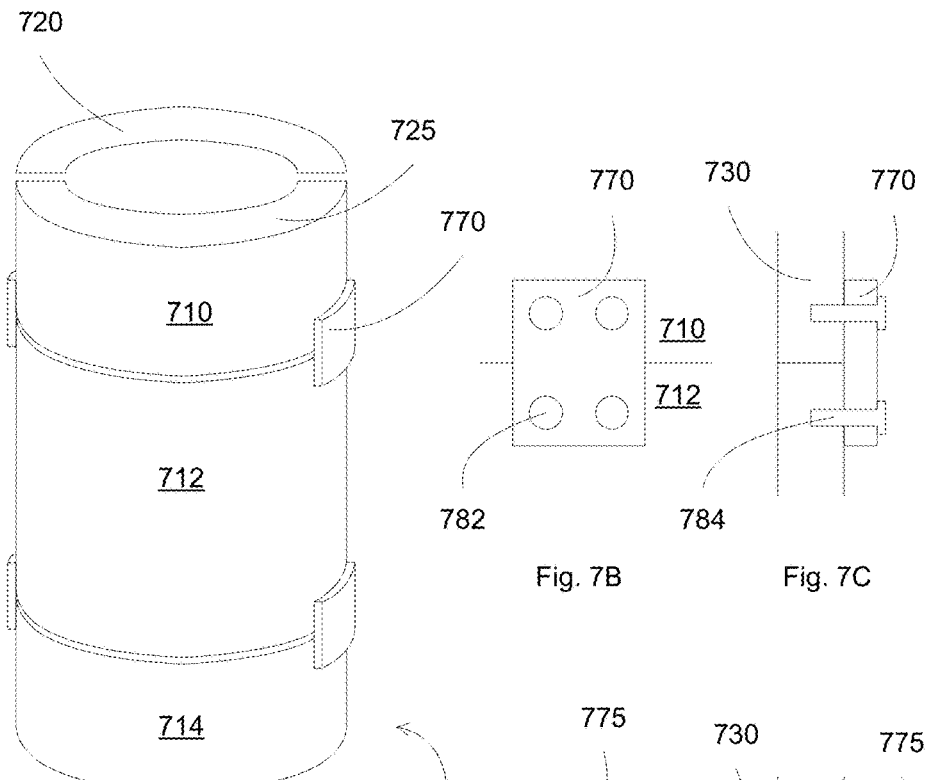
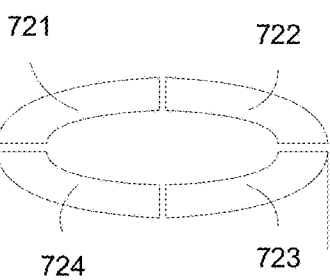
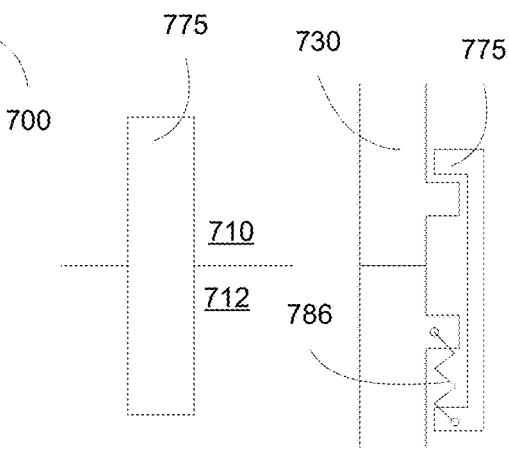
Fig. 7A
Fig. 7B
Fig. 7C
Fig. 7D
Fig. 7E
Fig. 7F

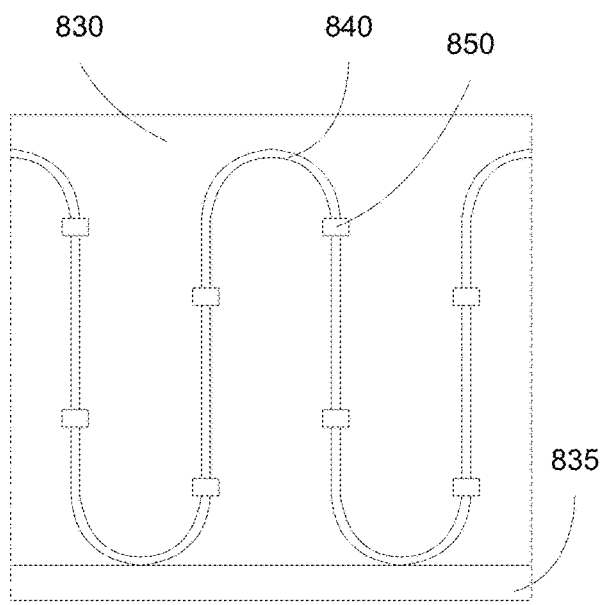
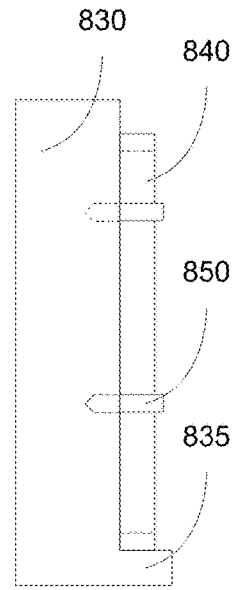
Fig. 8A  Fig. 8B
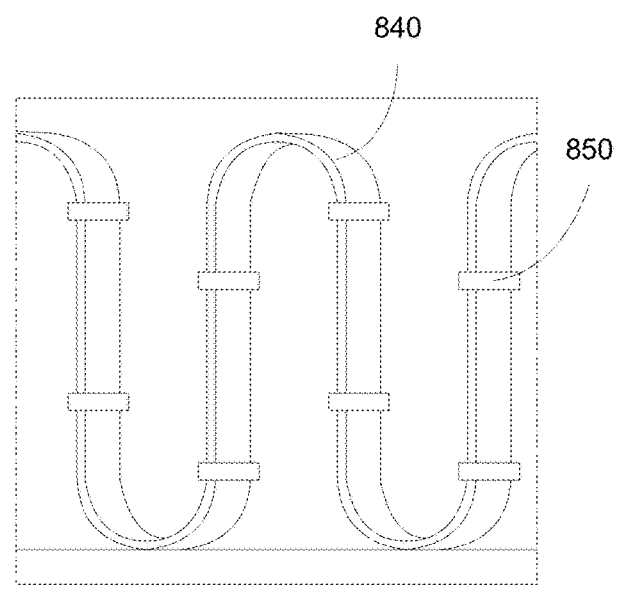
Fig. 8C

MODULAR HEATER

The present application claims priority from provisional application Ser. No. 61/573,451, filing date Sep. 6, 2011, entitled "Modular heater", and from provisional application Ser. No. 61/573,450, filing date Sep. 6, 2011, entitled "Heater elements with enhanced cooling", all of which are hereby incorporated by reference in their entirety.

BACKGROUND

Many process steps in the manufacturing of semiconductor devices are performed in a furnace. A furnace system can include a wafer loading assembly for transferring wafers to and from the furnace. Process gases can be introduced to the furnace for processing. A furnace can include a quartz tube, forming the furnace processing chamber. Heating elements can be provided on the outside the quartz tube. Heating insulation can be used to cover the heating elements, insulating the high temperature furnace processing chamber from the room temperature outside ambient. The heating insulation can minimize heat loss, resulting in higher heating temperature and faster ramp up rate for the furnace.

SUMMARY OF THE DESCRIPTION

In some embodiments, the present invention discloses a modular heater, and a furnace utilizing the modular heater assembly, that can include multiple heater modules. The heater modules can include mating features, such as a tongue and groove seal, and/or soft seal, to prevent radiation, thermal convection and thermal conduction leakage.

In some embodiments, the heater module can include heater elements coupled to an insulation layer. The heater elements can be placed on the insulation layer, or can be placed in a recess area of the insulation layer. Supports for the heater elements, together with expansion room for the heater elements can be included.

BRIEF DESCRIPTION OF DRAWINGS

FIGS. 7A-7F illustrate an assembled modular heater according to some embodiments of the present invention.

FIGS. 8A-8C illustrate a section of a heater module showing a heater element according to some embodiments of the present invention.

DETAILED DESCRIPTION OF THE PREFERRED EMBODIMENTS

In some embodiments, the present invention discloses modular heater, heater assembly using multiple modular heaters, and furnace utilizing the heater assembly. The modular heater can include mating features to couple with other modular heaters. The mating features can minimize or have zero heat loss at the seams between the modular heater portions, such as radiation loss, thermal convection or conduction loss.

Many areas of technology require the application of heat to an object or workpiece according to a specific heating-cooling protocol, referred to herein as "heating protocol" for economy of language, not intending to exclude thereby stages of the protocol in which the workpiece is cooled (or allowed to cool). Some examples include semiconductor materials processing, semiconductor device manufacture, general materials and surface processing, chemical reaction and process engineering, as well as numerous other examples from modern technology.

Rather than apply the appropriate heating and cooling in situ to a stationary workpiece, it is often convenient for the workpiece to move through a number of different stages or zones in which the appropriate heating or cooling of the workpiece occurs. The workpiece may be moved through several zones in a stationary heater or the heater may be moved so as to cause the workpiece to move through several zones of the heater. Either process may be used to apply the desired heating protocol to the workpiece. However, for economy of language, and since it is likely to be the most important practical embodiment, the present description focuses on the particular example of the workpiece moving through zones in a stationary heater, understanding thereby that a heater moving around a stationary workpiece is not excluded from the scope of some embodiments of the present invention.

Figure 1A:
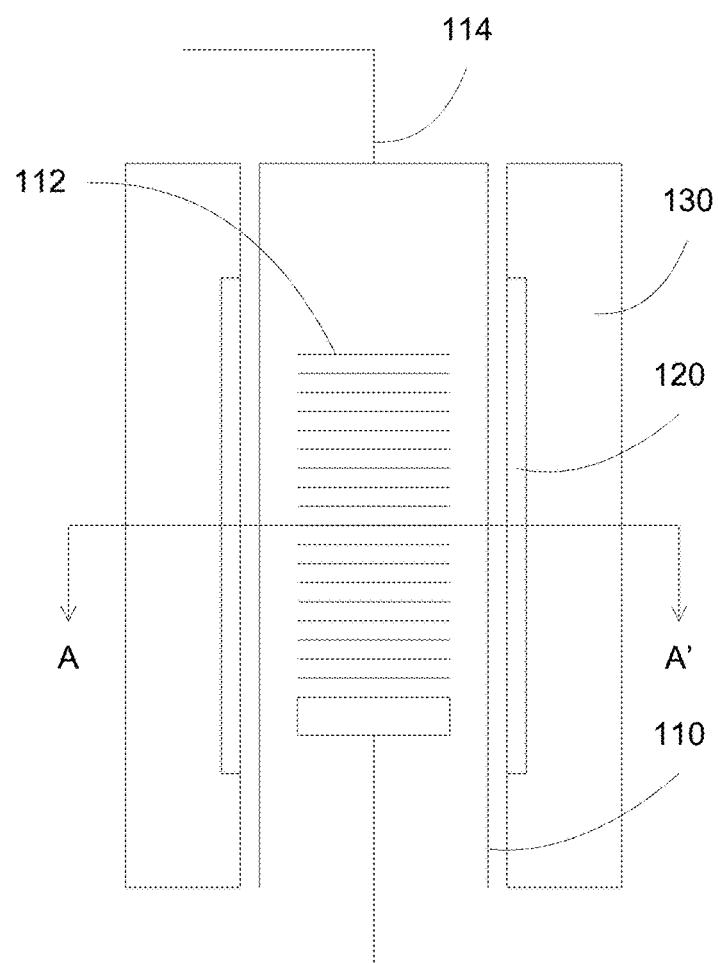
FIGS. 1A-1B illustrate a furnace and its temperature profile according to some embodiments of the present invention.
Figure 1B:
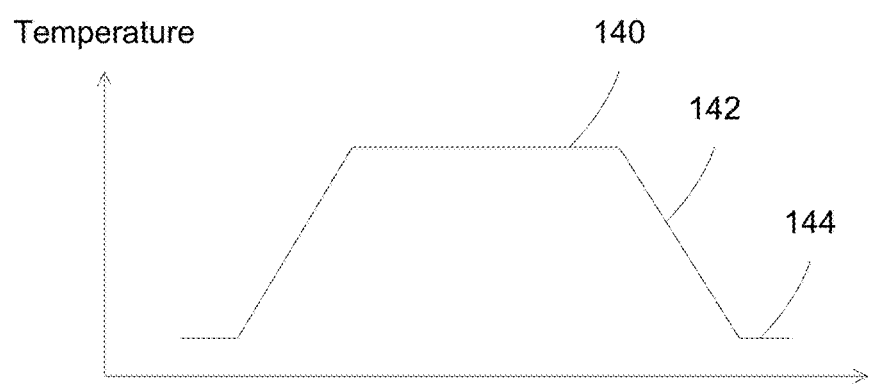

FIGS. 1A-1B illustrate a furnace and its temperature profile according to some embodiments of the present invention. In FIG. 1A, a chamber 110 can be heated, for example, by heater elements 120 to a process temperature 140. Wafers 112 can be placed in the chamber 110, which can be supplied with process gas 114. Insulation layer 130 can be used to cover the heater elements 120, insulating the heated chamber from the outside ambient. The insulation layer can limit the heat loss from the heated chamber 110, providing a temperature gradient 142 between the process temperature 140 within the chamber 110 and the temperature 144 of the outside ambient. FIG. 1B shows a schematic of the temperature profile across section A-A' or the furnace, showing a substantially uniform temperature 140 in the chamber region, and a gradual drop 142 in temperature to reach the outside temperature 144. The temperature profile is shown as an indication of the temperature variation, in which many details can be omitted, such as minor variations in the uniform profile 140 within the chamber, the gradual transition between the uniform profile 140 and the slope profile 142, and the non-linear slope profile 142 within the insulation layer 130.

When heaters with multiple zones are used to apply the desired heating protocol to the workpiece, often one zone is subject to more heat loss or higher demand for heat generation (or both) in comparison with other zones of the heater. Such higher demand for energy typically results in faster oxidation of various components comprising the heating elements, typically the metal used in resistance wire, and failure of that particular zone before failure of components in other zones.

One important practical example relates to heaters used in semiconductor manufacturing equipment, commonly known as diffusion furnaces. Diffusion heaters follow the pattern mentioned above, having one zone prone to failure before the others. It is commonly observed in diffusion furnaces that heaters in the "load zone" fail before other heater components more than 90% of the time. The "load zone" refers to the first zone that the load encounters when it enters the heater. Loads in semiconducting manufacturing processes typically include quartz materials, wafers, one or more boats which carry the wafers, one or more pedestals, and other items. The load zone is typically located on one extreme end of the heater, top or bottom, left or right, depending on the furnace orientation. To be concrete in our discussion, the present description describes chiefly the furnaces used in semiconductor manufacturing that are chiefly vertical furnaces with the load zone at the bottom. However, other orientations of furnaces and configurations of furnace zones can also make use of the improvements described herein as would be obvious to a person having ordinary skill in the art.

As the load typically enters the furnace at room temperature, while the load zone of the furnace typically has a temperature in the range from about 250 C to about 700 C, the load requires sufficient residence or dwell time in the load zone to absorb sufficient heat to reach thermal equilibrium with the temperature of the heater's load zone. As a result the load zone will typically be firing at 100% power, (as directed by the furnace controller), until the load temperature reaches the furnace temperature in the load zone. During this period the other zones, (typically designated zones 2-5 in diffusion heaters for the semiconductor industry), typically require much lower levels of power as these zones receive pre-heated workpieces from the prior zones. However, the higher power demanded by the load zone, typically the largest power consumer of all furnace zones, typically causes earlier failure of components within the load zone.

Conventional heaters employ a structure such that all the zones are a part of a single assembly, requiring that the entire heater be disposed off or refurbished after failure in any zone. Either replacement or refurbishment is costly, time consuming, inconvenient.

One of the reasons for the necessity of replacement or refurbishment of the entire heater upon failure of one zone is the use of continuous resistance wire that typically supplies heat to all zones of the heater (generally either three or five zones). Once the resistance wire has a failure, there is no choice but to rebuild or replace the entire heater.

In some embodiments, the present invention discloses a heater assembly that can be assembled from multiple heater modules, and the heater modules that can form a heater assembly. For example, a modular heater described herein can allow the heater to be made in sections that individually make up each zone. In the vertical modular heater assembly, if the bottom zone fails, the user can replace it with a new bottom zone only, and place the system back in use promptly. The same advantage applies to horizontal furnaces. When the load zone (or other zones) of a horizontal furnace fails, only the load zone needs to be replaced. The many benefits of modular design heaters include major savings in cost, quick turn around, lower allocation of capital for spares, among other things.

In some embodiments, the modularity feature can apply to every zone or multiple zones in a group. For some of the examples considered herein, a 5-zone heater can include three modules, a top module, a bottom module each having one heater zone, and a middle module having three heater zones. In some embodiments, the heater can include five separate modules.

Figure 2A:
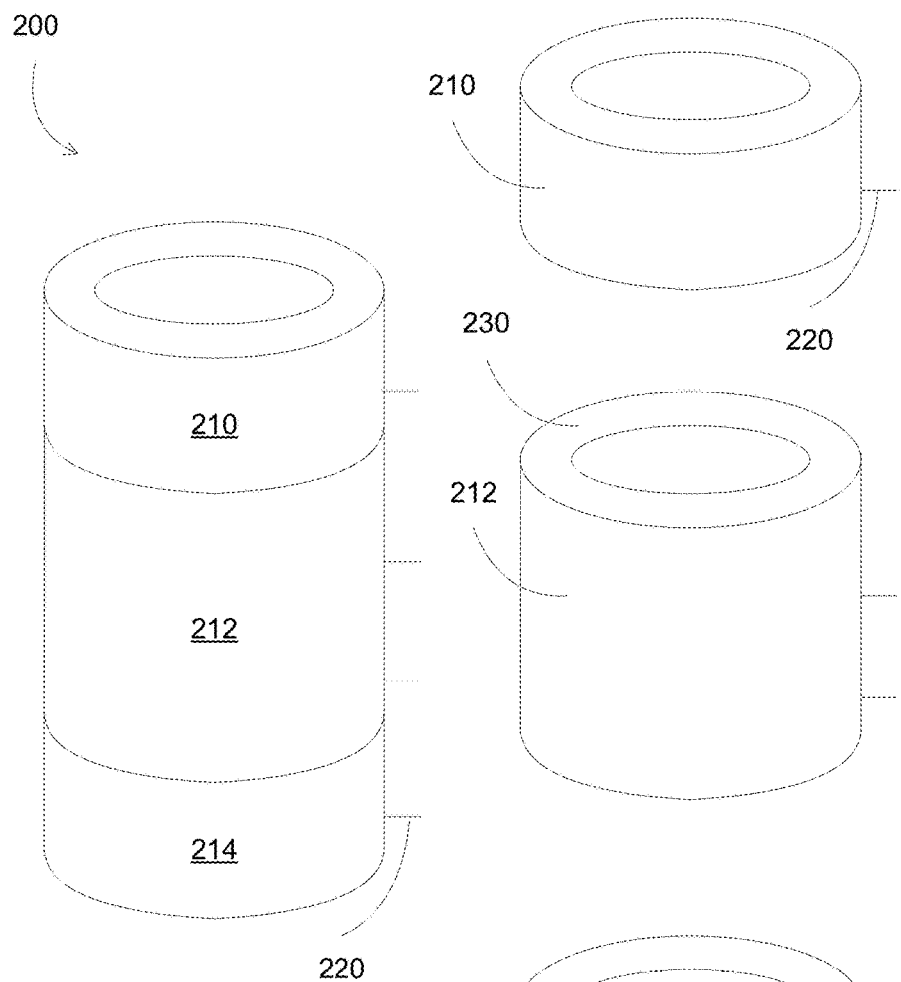
FIGS. 2A-2B illustrate a modular heater according to some embodiments of the present invention.
Figure 2B:
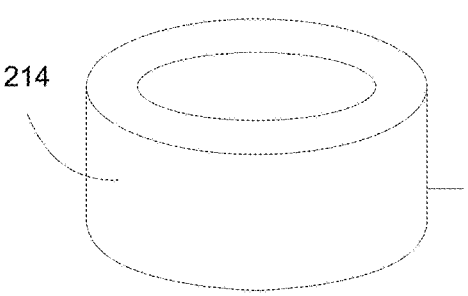

FIGS. 2A-2B illustrate a modular heater according to some embodiments of the present invention. FIG. 2A shows a modular heater having three modules which have been assembled to a complete modular heater. FIG. 2B shows a modular heater that has been disassembled into three separate modules. Other numbers of modules can also be used, such as two modules or five modules. In some embodiments, the number of modules can be based on the probability of heater failure, such as the portions of the heater having higher chance of failure can be constructed as a separate module, thus allowing replacement of the high failure portions while still keeping the low failure portions. For example, the heater sections near the entrance of exit can be fabricated as separate heater modules, since the thermal load can be higher at the interface portion with the ambient than at the central portion of the heater.

Three heater modules 210, 212, and 214 can be assembled to form a modular heater 200. Insulation layers 230 can be used to insulate and protect the heater elements, which is position within the insulation layer 230. Each module can have external connections 220 for the heater elements, which can be electrically connected to a power source. A heater module can have one or multiple heater elements, for example, a shower section heater module can have one heater element, while a long section can have multiple heater elements to provide uniform heating profiles. The multiple elements can be electrically coupled within the heater module, or can have external connections, which can provide electrical connections at the outside of the heater module.

In some embodiments, the present discloses seals or seams in the modular heater at the locations in which the modules come together that effectively contain the heat within the heater structure, yet still allow for convenient and relatively simple replacement of a module. For example, the seams can retain their heat-containing properties without substantial degradation despite (possibly) numerous module changes.

In some embodiments, the seals or seams can contain the heat by obstructing the radiation, which can be a prominent mode of heat transfer at temperatures as high as 1100 C. The seals or seams can also prevent heat loss by obstructing conduction and convection path. In some embodiments, the present invention discloses a seal between two adjacent modules that is gas tight and provides good thermal insulation, which includes a tongue-and-groove design.

Figure 3:
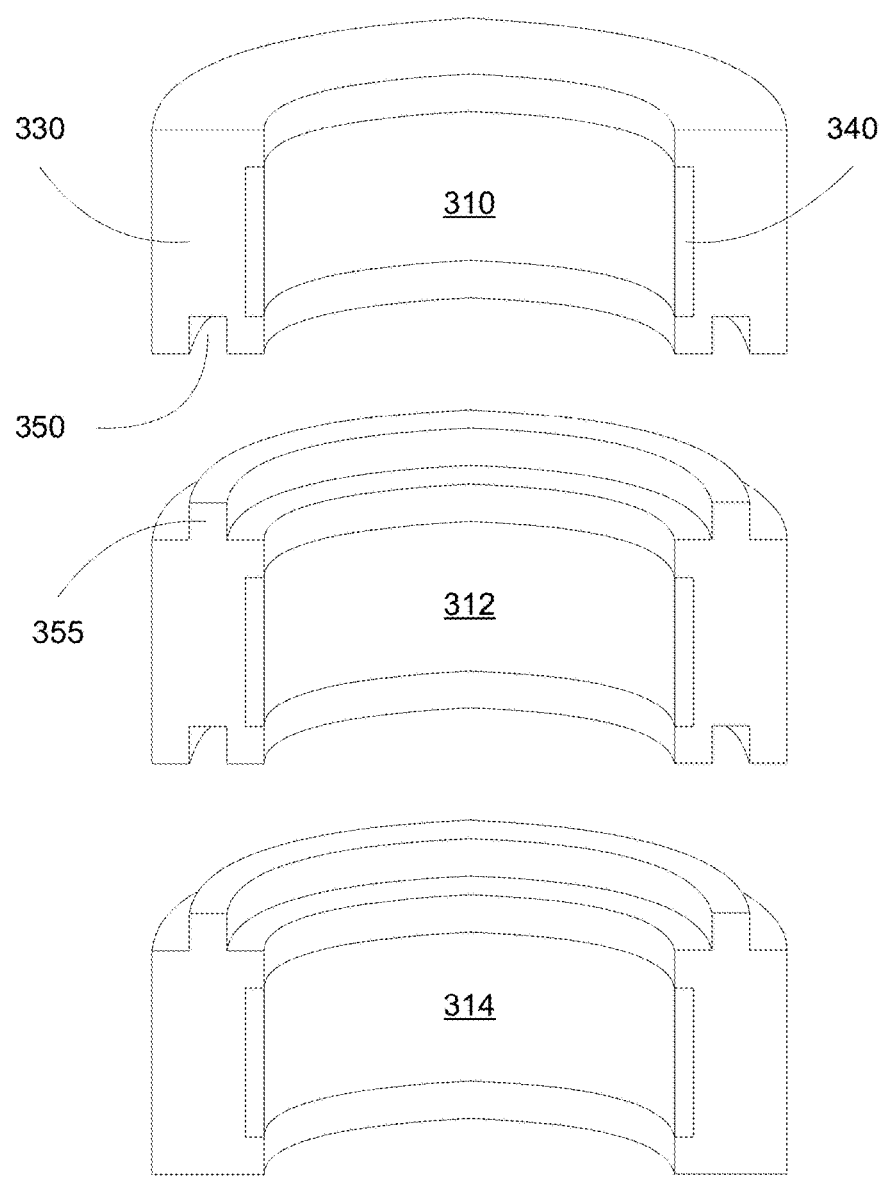
FIG. 3 illustrates an exploded view of a portion of a modular heater having three separate heater modules according to some embodiments of the present invention.

FIG. 3 illustrates an exploded view of a portion of a modular heater having three separate heater modules according to some embodiments of the present invention. Each heater module, e.g., 310, 312, and 314, can have a heater element 340 insulated by an insulation layer 330. As shown, the heater modules have one heater element, but multiple heater elements can be used within a heater module. A configuration of a tongue and groove seals can be used to couple the heater modules. For example, the heater module 312 can have a tongue 355, while the heater module 310 can have a mating groove 350. The tongue and groove seal can be formed surrounding the heater module, effectively blocking radiation while also eliminating or reducing convective and conductive heat loss between the heater modules. The tongue and groove structure can allow the construction of a modular heater, preserving the heating characteristics of an integrated heater, for example, by prevent heat loss by radiation, convection or conduction from the heater elements to the outside ambient. Each interface between two heater modules, e.g., between modules 310 and 312, and between modules 312 and 314, can include a tongue and groove seal, thus the modular heater having three modules can have two set of tongue and groove seals.

In some embodiments, the tongue and groove seal can include one or more protrusions, e.g., tongues, and one or more mating recesses, e.g., grooves. Thus a heater module can have a tongue structure, and an adjacent heater module can have a groove structure, which can be mated to the tongue structure to form a seal against heat loss.

Figure 4A:
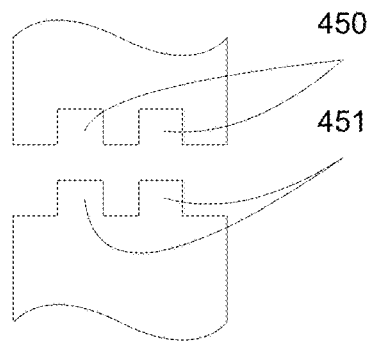
FIGS. 4A-4F illustrate other tongue and groove structures according to some embodiments of the present invention.
Figure 4D:
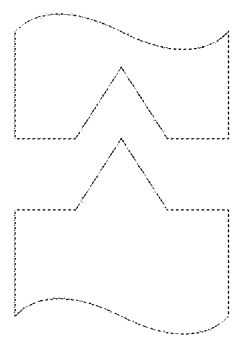
Figure 4B:
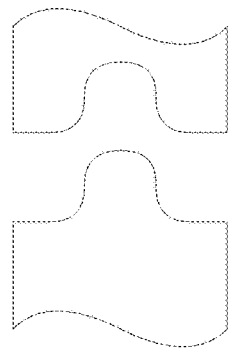
Figure 4E:
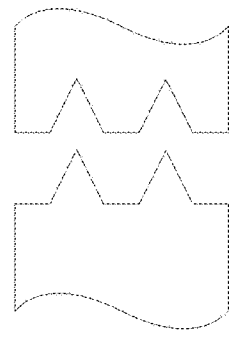
Figure 4C:
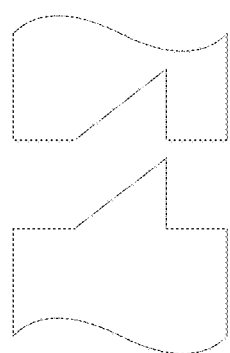

FIGS. 4A-4F illustrate other tongue and groove structures according to some embodiments of the present invention. In FIG. 4A, multiple tongues 451 in one module can be mated to multiple corresponded grooves 450 in an adjacent module. In FIG. 4B, the tongue and groove can have smooth surfaces, which can ease the construction and the assembling processes. In FIG. 4C, a triangular shaper tongue can groove is shown, in which the triangle can have a perpendicular edge toward the surface of the heater module. In FIG. 4D, another triangular tongue and groove structure is shown, in which the triangle can be substantially symmetrical. In FIG. 4E, multiple triangular shape tongues in one module can be mated to multiple corresponded grooves in an adjacent module. The tongue and groove structures can be mated by putting the modules against each other.

Figure 4F:
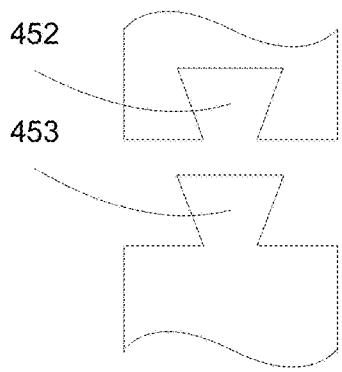

In FIG. 4F, a locked tongue and groove structure is shown, including tongue 453 and groove 452. The locked tongue and groove can be locked against certain removal direction, and can allow disassembling in certain direction. For example, the tongue and groove cannot be assembled or disassembled in a perpendicular direction wither respect to the module surface, e.g., the two modules having the tongue and groove structure are locked against removal through pulling apart. The two modules having the tongue and groove structure can be assembled by sliding along the surface of the modules, which, after assembled, are locked to prevent pulling apart. In some embodiments, other tongue and groove structures can be used.

In some embodiments, the present invention discloses a soft seal for sealing adjacent heater modules. The soft seal can also be used in a tongue and groove structure, further sealing the interface between the heater modules. A soft seal can include a deformable material, position between the heater modules, e.g., at the interface between two adjacent modules. When the two modules are attached to each other, the soft seal can be deformed under pressure, forming a seal against gaseous migration.

The soft seal can include flexible graphite, such as ribbon or braided seals. Reinforced graphite materials can also be used, for example, a rigid laminated gasket having soft layers bonded to a solid metal core. Braided carbon fiber, including reinforced graphite gland packing, can be used. In some embodiments, for use in semiconductor processing, high temperature refractory materials are advantageously employed for the soft seal. In some embodiments, an o-ring material such as Viton can be used, for example, to improve gas retention characteristics.

Figure 5A:
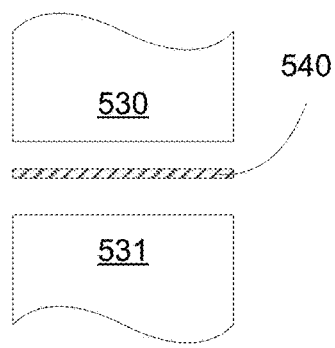
FIGS. 5A-5F illustrate different seal configurations for heater modules according to some embodiments of the present invention.
Figure 5B:
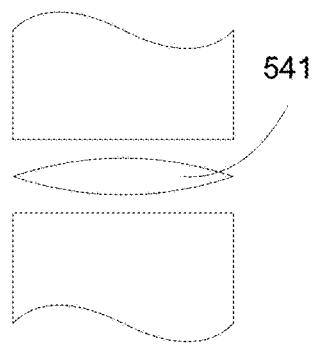
Figure 5C:
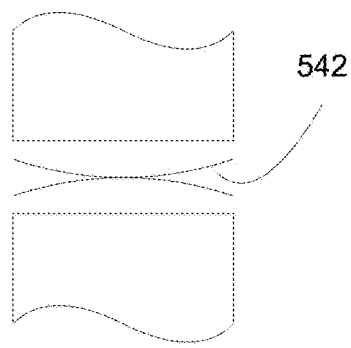
Figure 5D:
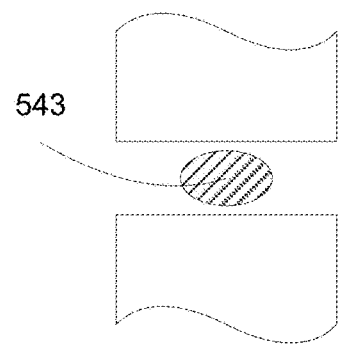
Figure 5E:
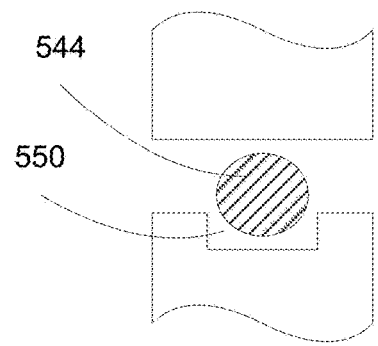
Figure 5F:
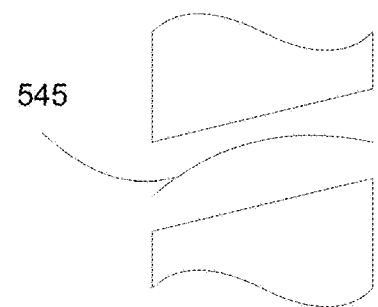

FIGS. 5A-5F illustrate different seal configurations for heater modules according to some embodiments of the present invention. In FIG. 5A, a thin seal 540 can be used, sealing the surfaces of two adjacent heater modules 530 and 531. The thin seal can include metal materials, graphite materials, or high temperature polymer materials. The seal 540 can have a ring structure, for example, if the heater module has a circular configuration. In FIG. 5B, a seal 541 can include two thin pieces of flexible material, such as metal, forming an oval shape. When compressed, e.g., due to the coupling of the two modules, the seal 541 can seal the interface between these two modules. In FIG. 5C, a seal 542 can include two thin pieces of flexible material, such as metal, forming an X shape. When compressed, e.g., due to the coupling of the two modules, the seal 542 can seal the interface between these two modules. In FIG. 5D, the seal 543 can include a flexible or deformable oval or circular band, such as a polymer or soft graphite core in braided fiber. In FIG. 5E, one or both surfaces of the heater module can have a recess, e.g., recess 550, to prevent the seal 544 from moving. In FIG. 5F, the interfacial surfaces between the two modules can form an angle with the modules, which can reduce the heat loss by lengthening the gap between the two modules. A seal 545, such as a piece of flexible metal, can be used for sealing the gap between the modules.

In some embodiments, the seals between the heater modules can include a tongue and groove structure, together with a soft seal. The tongue and groove feature can prevent radiation loss, and the soft seal can prevent gaseous species from escaping the heater assembly.

Figure 6A:
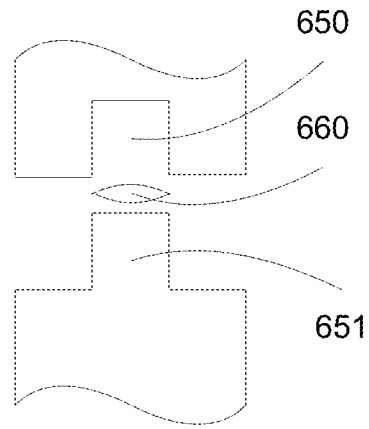
FIGS. 6A-6F illustrate tongue and groove structures with soft seal features according to some embodiments of the present invention.
Figure 6B:
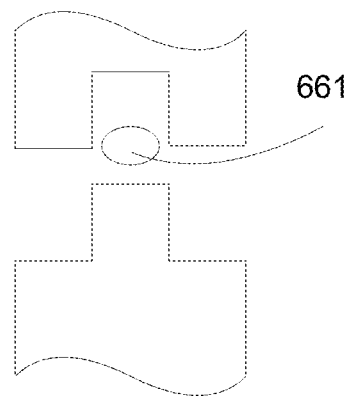
Figure 6C:
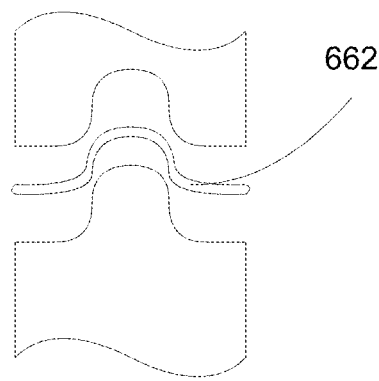
Figure 6D:
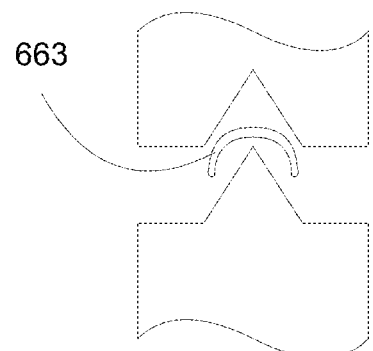
Figure 6E:
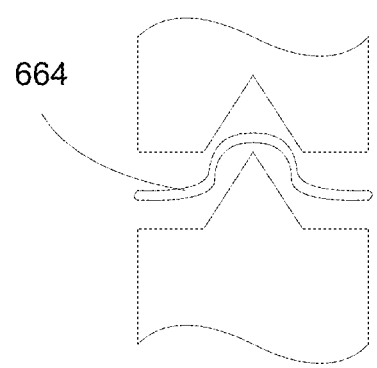
Figure 6F:
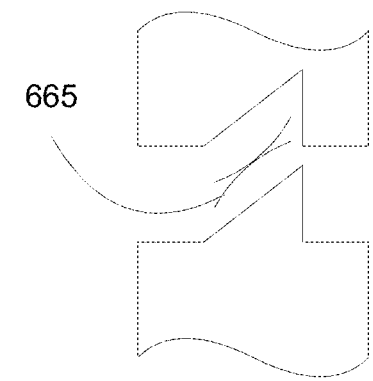

FIGS. 6A-6F illustrate tongue and groove structures with soft seal features according to some embodiments of the present invention. In FIG. 6A, a tongue 651 can be used in conjunction with a groove 650 between two adjacent heater modules. Between the two modules is a soft seal 660 or 665, which can include a two-piece flexible curve metal. The soft seal can be disposed in the tongue and groove location, but can also be placed in any place between the two modules. Further, other types of soft seal can be used, such as the o-ring 661 (FIG. 6B), braided carbon fiber 662, 663, 664 (FIGS. 6C, 6D, and 6E), or graphite reinforced gland packing seals. The soft seal can be confined to the tongue and groove area (FIG. 6D and FIG. 6F), or can cover the whole surface of the interface between modules (FIG. 6E).

In some embodiments, the heater modules can be assembled to form a modular heater. The assembling can include nut-and-bold plates for securing the modules. The assembling can include removable fasteners for quick removal. The assembling can include a combination of nut/bolt and fasteners. Each insulation block can align and stack up with the insulation block below it at an interface point, where the insulation blocks align in a vertical or horizontal fashion. In some embodiments, the meshing characteristics at the seam interface of the insulation blocks provide adequate alignment of the modules.

FIGS. 7A-7F illustrate an assembled modular heater according to some embodiments of the present invention. FIG. 7A shows an assembled modular heater 700, assembled with plates 770. FIGS. 7B and 7C show a top view and a cross section view of a plate 770, respectively. A modular heater 700 can include three heater modules 710, 712 and 714. Each module can include two sections 720 and 725 assembled together. Each section can have the shape of a half cylinder, with the tongue and groove and/or soft seal disposed on the half circular surfaces between the adjacent modules, e.g., between modules 710 and 712, and between modules 712 and 714. In some embodiments, the insulation layer can be constructed in more than two half cylindrical shapes. For example, multiple sections can be used, such as 4 or 6 sections having segmented cylindrical shapes to form a full circle. The sections can have similar shape or equal circular segment, e.g., in a module having 4 sections 721, 722, 723, and 724 as shown in FIG. 7F, each section can have 90 degrees segmented cylindrical shape. Alternatively, the sections can have different shapes.

Once the seal, e.g., tongue and groove and/or soft seal, is placed in between the heater modules and the modules are aligned, the modules are fastened together, for example, by plates 770 with sufficient strength. The plates 770 can have four holes 782, one in each corner. The plates 770 can be fastened to the heater module outer surface, keeping the modular heater as one assembly. The plate 770 can be fastened by bolts 784, securing the plate to the external shell 730, typically made of stainless steel. In some embodiments, the modular heater including multiple heater modules can allow replacement of individual modules. For example, if the top module 710 needs to be replaced in heater assembly 700, the plates 770 are removed, a new top module 710 is placed on a secure platform, a soft seal is placed on top of a tongue section of the middle module 712, and then the new top module is then placed on top of the middle module 712. The modules can be self-aligned when they are fastened together with plates 770.

In some embodiments, easily removed fasteners 775 can be used instead, or in addition, to the plates 770. FIGS. 7D and 7E show a top view and a cross section view of a fastener 775, respectively. A fastener 775 can secure modules 710 and 712, for example, by pushing the two modules together through a spring 786. The spring 786 can be coupled to module 712 and to fastener 775, thus can easily release the two modules.

In some embodiments, the present modular heater can include heater elements, such as resistance wires for heating. For example, each module of the modular heater can include an insulation block, which can include either a single piece of insulation or one or more components integrally joined together to make up the insulation block surrounding that particular furnace module. The resistance wire for heating can be used in the form of a strip, attached to the insulation block by staples or other suitable fasteners. The staples can be made of a high temperature insulator material, for example, a similar ceramic material as the outer coating of the resistance wire or strip.

In some embodiments, the heater elements can use strip wire. The strip wire can expand only in one direction as the strip temperature increases. Reserved space can be provided to allow the strip to expand and retract freely as needed. The staples can be placed at locations that can allow free movement of the strip wire in the direction of elongation, such as along the length of the strip wire, and not at the end of the strip wire. In addition, the staples can be loosely attached so as to provide some ability for the strip wire to move as needed. In some embodiments, a main function of the staples is to keep the strip wires in the right location. The strip wires can be shaped in any form, such as a zigzag form, spring shaped form, or other forms.

In some embodiments, round wires can be used, with the insulation layer designed to be accounted for the elongation and movement of the round wire at higher temperatures. The round wires can be placed in channels in the insulation layer. Additional cavity in the insulation layer block at the turning point of the round wires can allow for expansion of the round wires at higher temperatures. In some embodiments, the staple can hold the round wire in place.

In some embodiments, the insulation layer can have a lower edge, for example, fabricated as an integral part of the insulation layer (or sections of the insulation layer). This lower edge can provide support to the bottom of the heater elements, such as strip wires or round wires, and can also act as an insulator between the heater elements of adjacent heater modules. The staples can anchor the heater elements such that the heater elements are isolated, e.g., do not come in contact with one another.

In some embodiments, a vestibule block can be included at one or both ends of the modular heater to provide support for the modules at the ends of the heater. The vestibule block can also become a part of the insulation layer, as is the case with the top module or bottom module.

FIGS. 8A-8C illustrate a section of a heater module showing a heater element according to some embodiments of the present invention. FIG. 8A shows a side view, FIG. 8B shows a cross section view, and FIG. 8C shows a perspective view of a section of a heater module. A heater element 840, such as a strip wire or a round wire can be fastened to an insulation layer 830, for example, by multiple staples 850. The heater elements 840 can be placed on the surface of the insulation layer 830. A lower edge support 835 can be used to support the heater element 840. The lower support 835 can be an integral part of the insulation layer 830. The staples 850 can be placed along the heater elements, configured to allow the heater element to expand, e.g., at the top portion opposite the lower support 835. The staples 850 can also be loosely fastened to the heater elements 840, for example, to allow the heater elements to expand somewhat in the horizontal direction. The staples can be fastened to the insulation layer 830, or can pass through the insulation layer, and secured at the backside of the insulation layer.

Figures 9A, 9B, 9C, 9D:
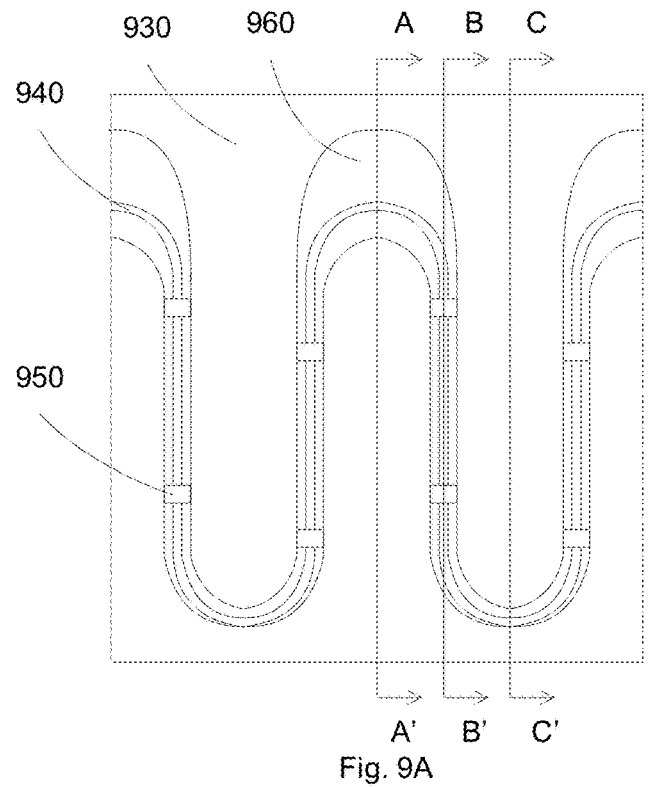
FIGS. 9A-9D illustrate another section of a heater module showing a heater element according to some embodiments of the present invention.

FIGS. 9A-9D illustrate another section of a heater module showing a heater element according to some embodiments of the present invention. FIG. 9A shows a side view, and FIG. 9B-9D show different a cross section view of a section of a heater module. A heater element 940, such as a strip wire or a round wire can be fastened to an insulation layer 930, for example, by multiple staples 950. The heater elements 940 can be placed in a recess 960 of the insulation layer 930. The recess can contact the heater elements at the bottom portion, for example, to provide support for the heater elements. The recess can have an empty portion at the top portion, for example, to allow the heater elements to expand and still stay within the recess area. The heater elements can be loosely placed in some portions of the recess, such as the vertical portions, to allow the heater elements to expand somewhat in the horizontal direction. The staples 950 can be placed along the heater elements, configured to allow the heater element to expand, e.g., at the top portion opposite the lower support 835. The staples 950 can also be loosely fastened to the heater elements 840, for example, to allow the heater elements to expand somewhat in the horizontal direction. The staples can be fastened to the insulation layer 930, or can pass through the insulation layer, and secured at the backside of the insulation layer.

In some embodiments, the heater elements, e.g., the heater size, can be optimized based on the thermal energy demand for each module. Typically heaters used for diffusion furnaces or other applications, utilize one resistance wire or strip size to construct the entire heater. That means all of the zones, regardless of their location and demand requirements will be made of the same size and specification wire or strip. In this case, the zone with the higher demand, like zone 5, will clearly fail before the other ones.

In some embodiments, the present invention discloses a modular heater which can optimize each heating zone with the most suitable wire or strip size for optimum performance. For example, modules located at the ends of the heater, such as modules 310 and 314 (see FIG. 3), are subject to more heat loss. Therefore, these zones will be made with higher diameter wire or thicker strips. Employing larger amounts of resistance wire or strip material will proportionally extend the life of the zone. Varying the cross sectional size of the resistance wire or strip in different zones of the modular heater can also be employed with some embodiments of the present invention, an advantage and design flexibility not available in conventional heaters.

Figure 10:
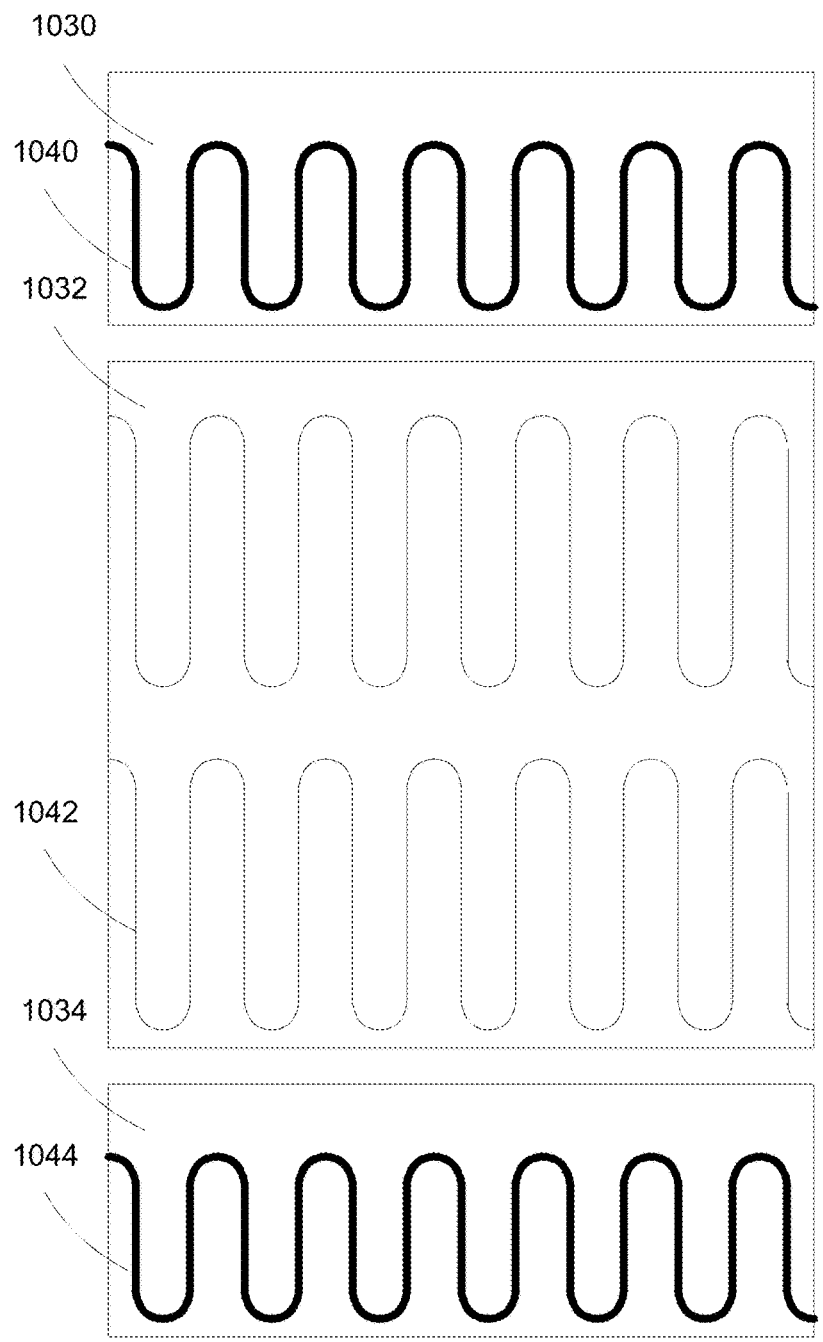
FIG. 10 illustrates a modular heater showing the heater elements for different modules according to some embodiments of the present invention.

FIG. 10 illustrates a modular heater showing the heater elements for different modules according to some embodiments of the present invention. At the end modules 1030 and 1034, the heater elements 1040 and 1044 can have large wire size as compared to the wire size of the heater elements 1042 of middle module 1032.

In some embodiments, the present invention discloses a modular heater with improved temperature controls. Channels can be incorporated with the insulation layer to change boundary conditions of the insulation layer, affecting the heating or cooling rates of the furnaces. Natural convection flow or forced flow can be used within these channels.

In some embodiments, a plenum can be positioned at one end of the channels for providing flows to the multiple channels. A plenum airflow through the insulation can be controllable by the use of various speeds for the blower generating the airflow. A controller can be included to control the flow, for example, through the software operating the system, or by a mechanical switch directly operating the blower. In some embodiments, the desirable airflow rate can be dependent on the temperature inside the heater, which can further optimize the cool down rate. For example, the airflow can be lower at higher temperatures and then increases as the heater cools down to lower temperatures.

A channel restrictor can be used to control the conductivity of the channels. For example, a top ring can be included to control the amount of airflow through the heater. The ring can be adjusted manually or pneumatically by activation of actuators controlled by system controller.

In some embodiments, at the top of a heater assembly, there is a flat ring with the same hole pattern and size as the channels of the heater assembly. The ring can move in place to alter the exposed size of the holes. For example, when the holes between the ring and top of the heater are completely aligned, the holes are 100% open. The top plate can completely block the airflow by rotating in place. A screw can be used to secure the location of the plate such that it cannot move once the screw is tightened. In some embodiments, a controller can be included to regulate, e.g., by moving the top plate, the flow through the channels.

Figure 11:
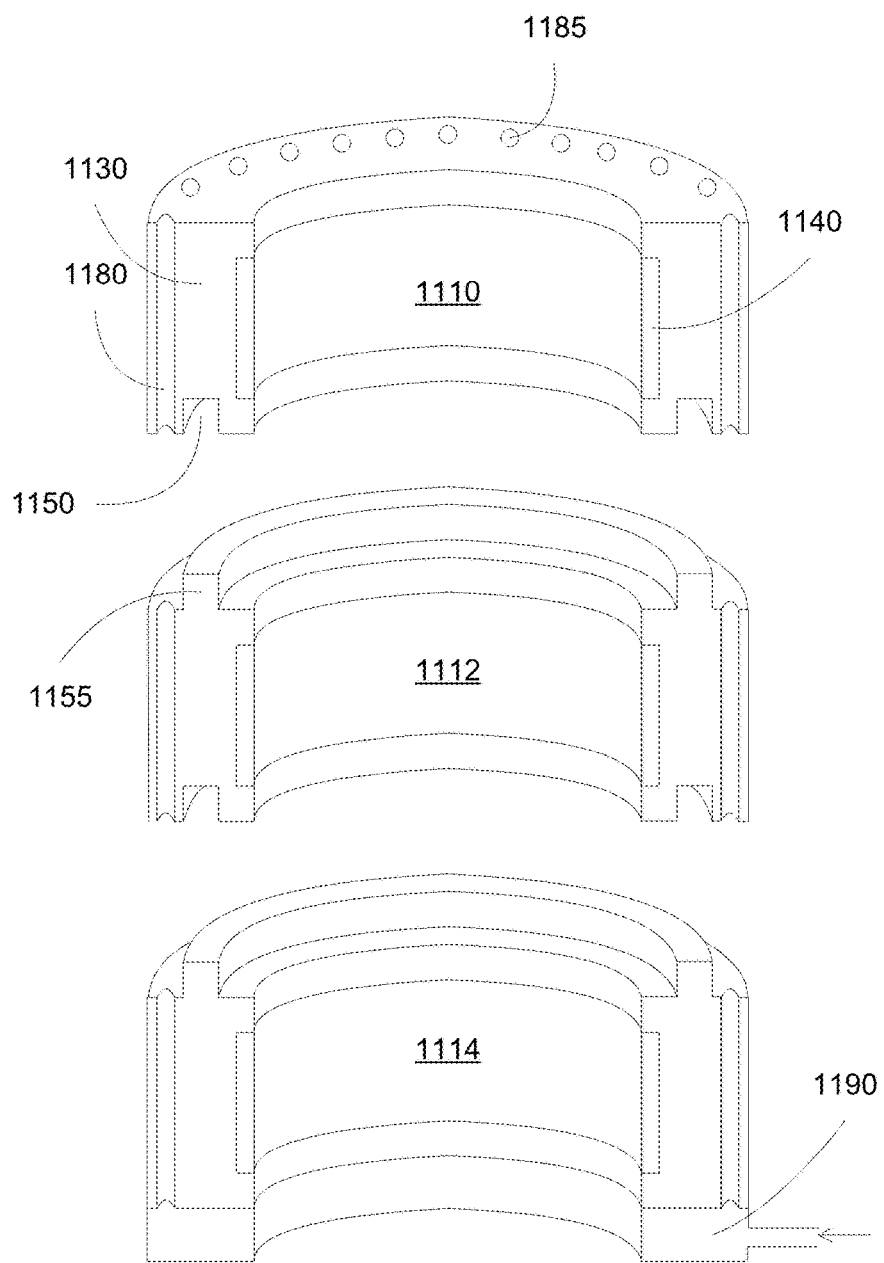
FIG. 11 illustrates a configuration of a heater assembly according to some embodiments of the present invention.

FIG. 11 illustrates a configuration of a heater assembly according to some embodiments of the present invention. The modular heater can have three heater modules. Each heater module, e.g., 1110, 1112, and 1114, can have a heater element 1140 insulated by an insulation layer 1130. A configuration of a tongue and groove seals can be used to couple the heater modules. For example, the heater module 1112 can have a tongue 1155, while the heater module 1110 can have a mating groove 1150. An insulation layer 1130 can have multiple embedded channels 1180 having opening 1185, which can be configured to be aligned with each other when the modules are assembled. A plenum 1190 can be placed at one end, e.g., the bottom, of the channels, providing fluid flow, e.g., gas or liquid flow, to the multiple channels. A flow provider, such as a blower for gas flow or a liquid pump for liquid flow, can be coupled to the plenum to provide forced fluid flow. A controller can also be included to control the fluid flow to the plenum, and/or to the channels.

A top plate can be placed at another end, e.g., the top, of the channels to control the fluid flow through the channels. For example, the top plate can include multiple holes, which can be aligned with the channel exit openings. The top plate can block a portion of the channel, and allow another portion of the channels to pass through. The top plate can move, for example, by rotating, to change the blocking and allowing portions of the channels. In some embodiments, a controller can be included to regulate the flow through the channels, e.g., by moving the top plate.

In some embodiments, natural convection cooling can be used. A heater assembly can be used in furnaces for Low-Temp application, in which the enhanced cooling can be constructed without the plenum used for forced-air cooling. For example, a heater can benefit from natural convection cooling from bottom to the top of the heater. A top ring can control the airflow going through the shell of the heater.

Figure 12:
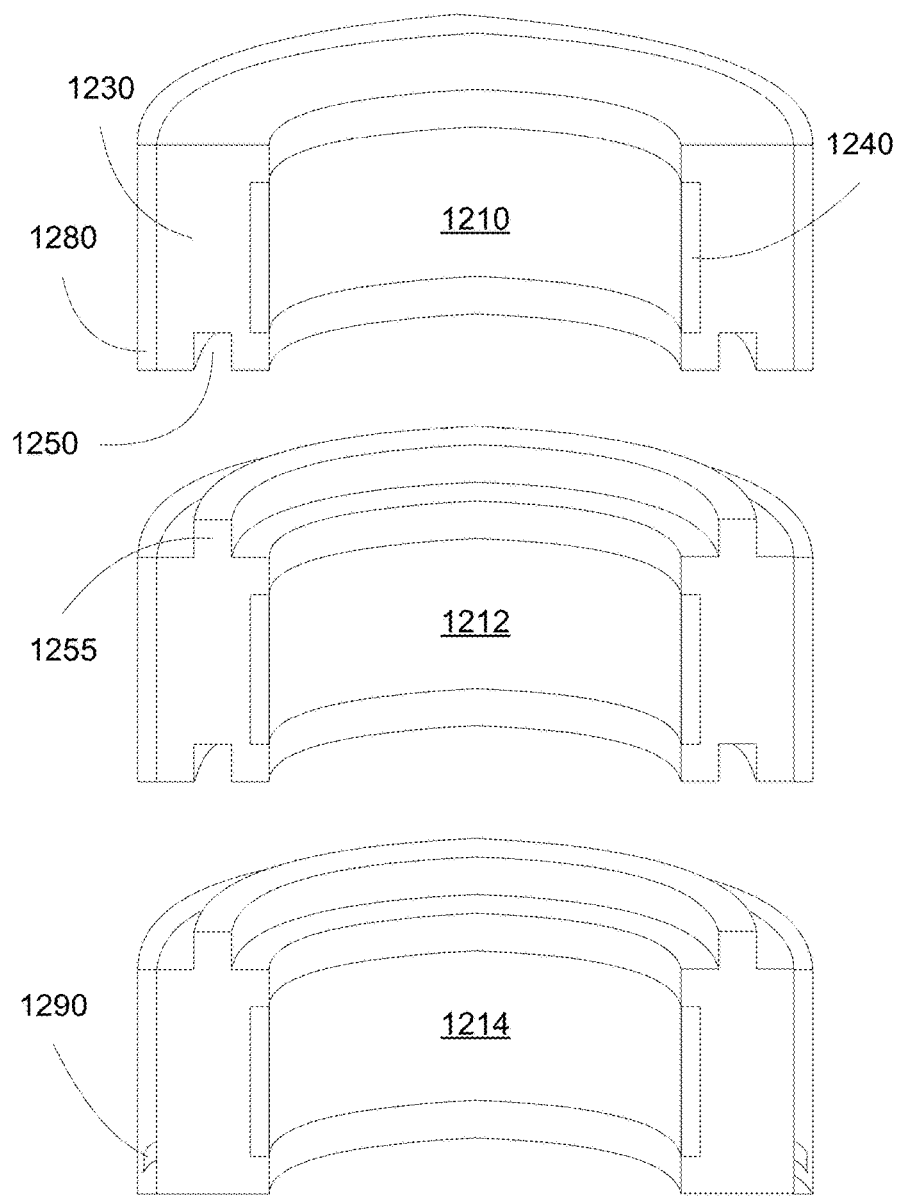
FIG. 12 illustrates another configuration of a heater assembly according to some embodiments of the present invention.

FIG. 12 illustrates another configuration of a heater assembly according to some embodiments of the present invention. The modular heater can have three heater modules. Each heater module, e.g., 1210, 1212, and 1214, can have a heater element 1240 insulated by an insulation layer 1230. A configuration of a tongue and groove seals can be used to couple the heater modules. For example, the heater module 1212 can have a tongue 1255, while the heater module 1210 can have a mating groove 1250. An insulation layer 1230 can have channels 1280 disposed at the outer surface, between the insulation layer 1230 and an outer shell, which can be configured to be aligned with each other when the modules are assembled. Openings 1290 can be placed at one end, e.g., the bottom, of the channels, providing fluid flow, e.g., gas or liquid flow, to the channels 1280. A controller can also be included to control the fluid flow to the openings 1290. In addition, a plenum can be included, for example, having openings to provide forced fluid flow to the channel 1280. Other configurations can be used, such as openings without plenum, or plenum without the openings.

A top plate can be placed at another end, e.g., the top, of the channels to control the fluid flow through the channels. For example, the top plate can include multiple holes, which can be aligned with the channel exit openings. The top plate can block a portion of the channel, and allow another portion of the channels to pass through. The top plate can move, for example, by rotating, to change the blocking and allowing portions of the channels. In some embodiments, a controller can be included to regulate the flow through the channels, e.g., by moving the top plate. Further detailed of the cooling channels can be found in a co-pending application of the same inventor, application Ser. No. 13/602,322 entitled "Heater elements with enhanced cooling", hereby incorporated by reference in its entirety.

Figures 13A, 13B:
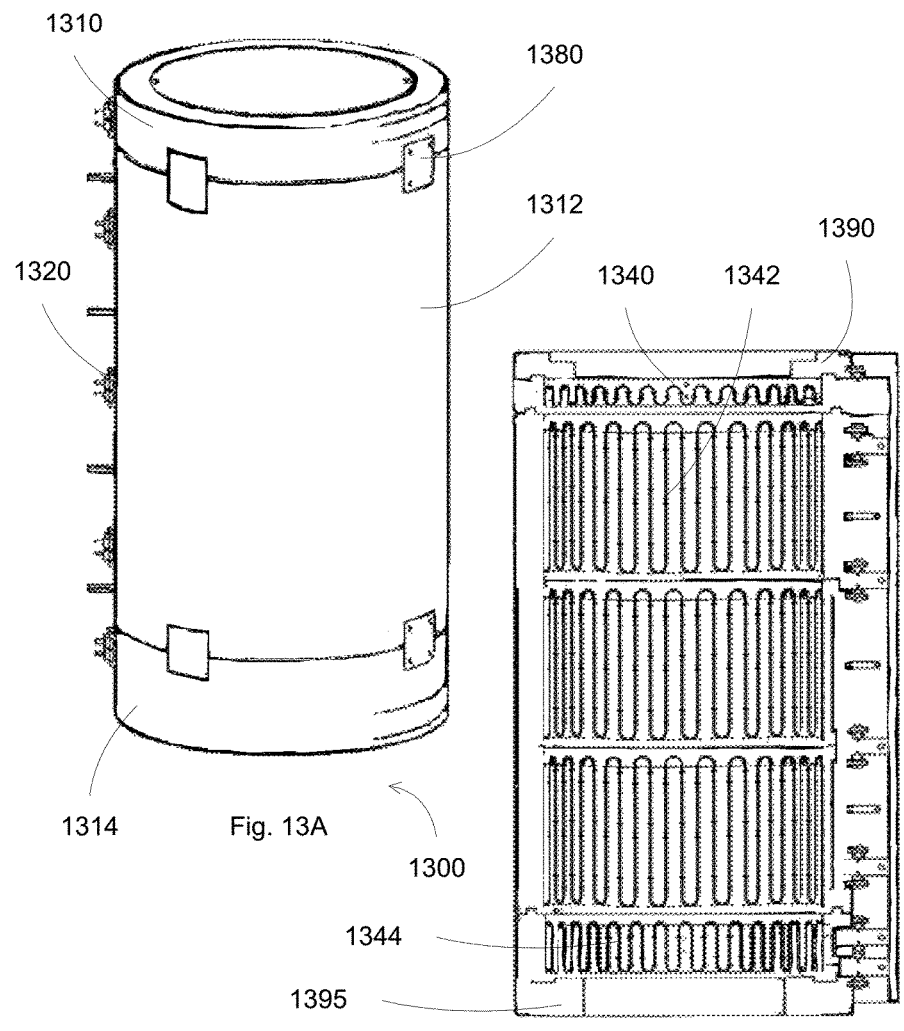
FIGS. 13A-13B illustrate a module heater according to some embodiments of the present invention.

FIGS. 13A-13B illustrate a module heater according to some embodiments of the present invention. FIG. 13A shows a perspective view and FIG. 13B shows a cut away view of a modular heater. A modular heater 1300 can be assembled from three heater modules 1310, 1312, and 1314. Multiple plates 1380 can be used to fasten the heater modules. Heater elements within the heater modules can include external electrical connections 1320. Different heater elements can be used in different heater modules. For example, a short heater element 1340 can be used in the short heater module 1310. A medium heater element 1344 can be used in the medium heater module 1314. Multiple long heater elements 1342 can be used in long heater module 1312. In addition, the power rating for different heater elements can be different, such as heater wire sizes or materials. For example, entrance and exit modules, e.g., module 1314 and 1310, can be higher than the middle module, e.g., module 1312. At the outermost portion of the modular heater, a vestibule support 1390 and 1395 can be used.

Figure 14A:
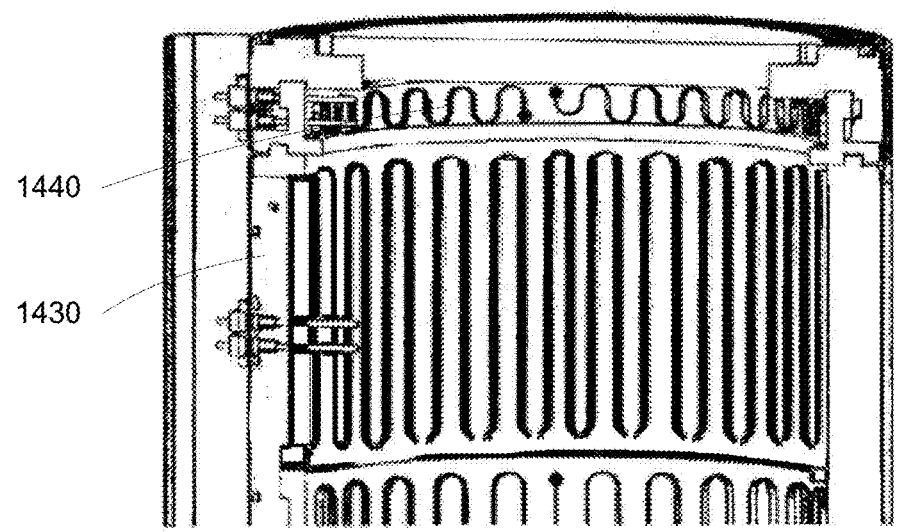
FIGS. 14A-14B illustrate detailed cut away views of a modular heater according to some embodiments of the present invention.
Figure 14B:
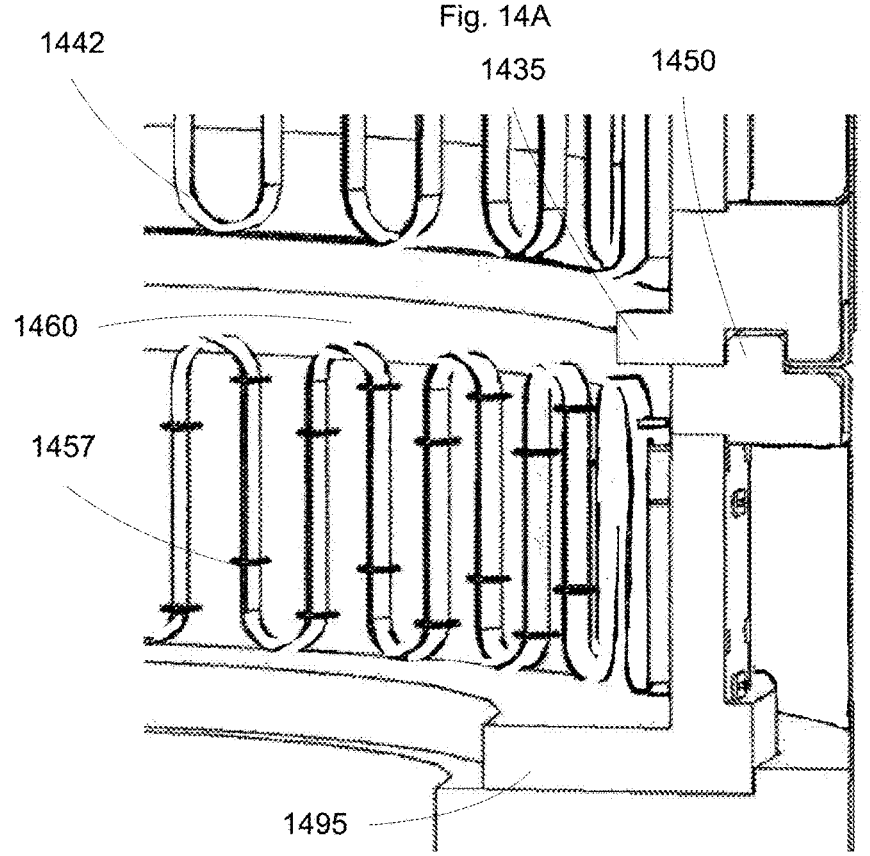

FIGS. 14A-14B illustrate detailed cut away views of a modular heater according to some embodiments of the present invention. FIG. 14A shows a portion of a top heater module, and FIG. 14B shows a portion of a bottom heater module. Heater elements 1440 and 1442 can be fastened to an insulation layer 1430 by multiple staples 1457. Bottom support 1435 can be used to support the heater elements, e.g., heater element 1442. Empty space 1460 can be provided at the top of the heater elements to allow for the thermal expansion of the heater elements upon heating to high temperatures. Larger bottom support 1495, e.g., bottom vestibule, can be included. A tongue and groove seal 1450 can be used to couple the heater modules.

Figure 15A:
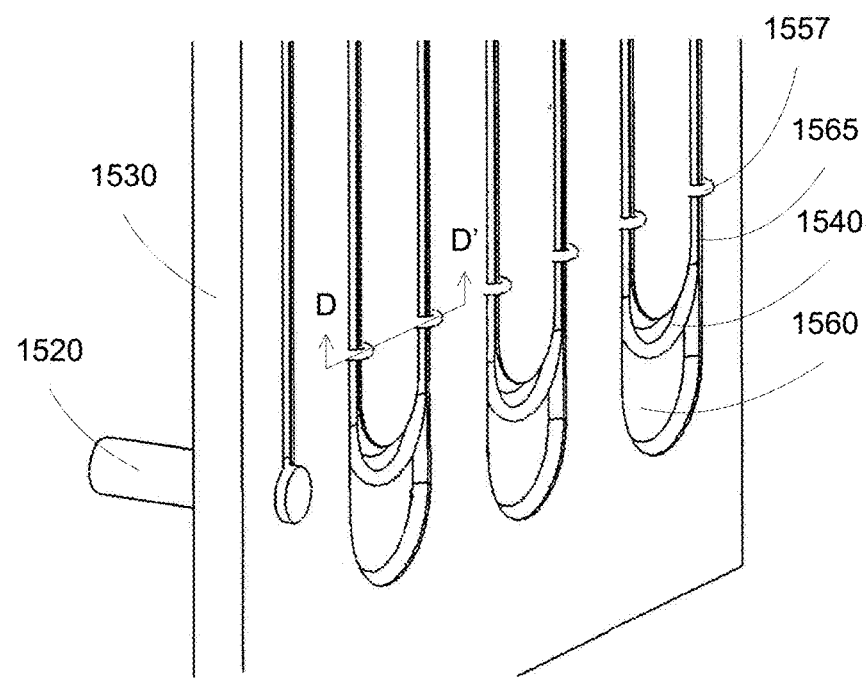
FIGS. 15A-15B illustrate detailed cut away view of a heater element placement according to some embodiments of the present invention.
Figure 15B:
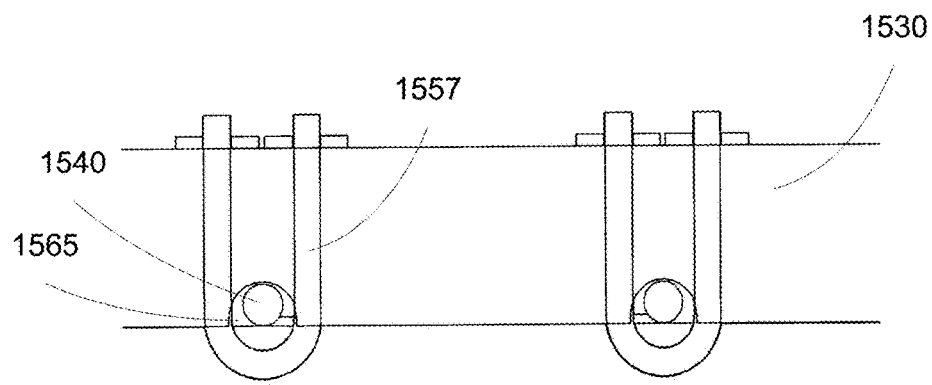

FIGS. 15A-15B illustrate detailed cut away view of a heater element placement according to some embodiments of the present invention. FIG. 15A shows a perspective view, and FIG. 15B shows a cross section view D-D'. A heater element in the form of a round wire 1540 can be embedded in an insulation layer 1530, for example, in a recess 1560. Electrical contact 1520 can be included to pass the heater element 1540 to an external connection. The recess 1560 can be designed to allow room for thermal expansion. The recess 1560 can also provide a channel 1565 for placing the heater wire 1540. Staples 1557 can loosely hold the heater element 1540 in place, preventing the heater element from excessive movement, but still allow some movement, e.g., within the channel 1565. The staple 1557 can be secured to the back of the insulation layer 1530, for example, by locked nuts.

In some embodiments, the modular heater can include multiple heater modules together with an integrated external shell. The heater modules can include one or more insulation layers and one or more heater elements, coupling together. An external shell can be used, covering all heater modules. Since the external shell can integrate all heater modules, the requirement for the seal between the modules, e.g., the tongue and groove and/or the soft seal, can be relaxed. In some embodiments, the heater modules can be placed against each other to form a large heater module, and an external shell can cover all heater modules, e.g., the large heater module. Channels can be provided, for example, between the insulation layer and the external shell for improving control of the modular heater.

In some embodiments, the present invention discloses a modular heater, and a furnace having the modular heater. The modular heater can include multiple heater modules attached to each other, for example, by a tongue and groove feature, by a soft seal feature, by mechanically pressing the module together, or by any combination thereof. The modular heater can include an external shell, for example, a stainless steel shell, wherein the external shell covers all heater modules. In some embodiments, the external shell is separated from the insulation layers of the heater modules, forming one or more channels between the heater modules and the external shell.

Figure 16:
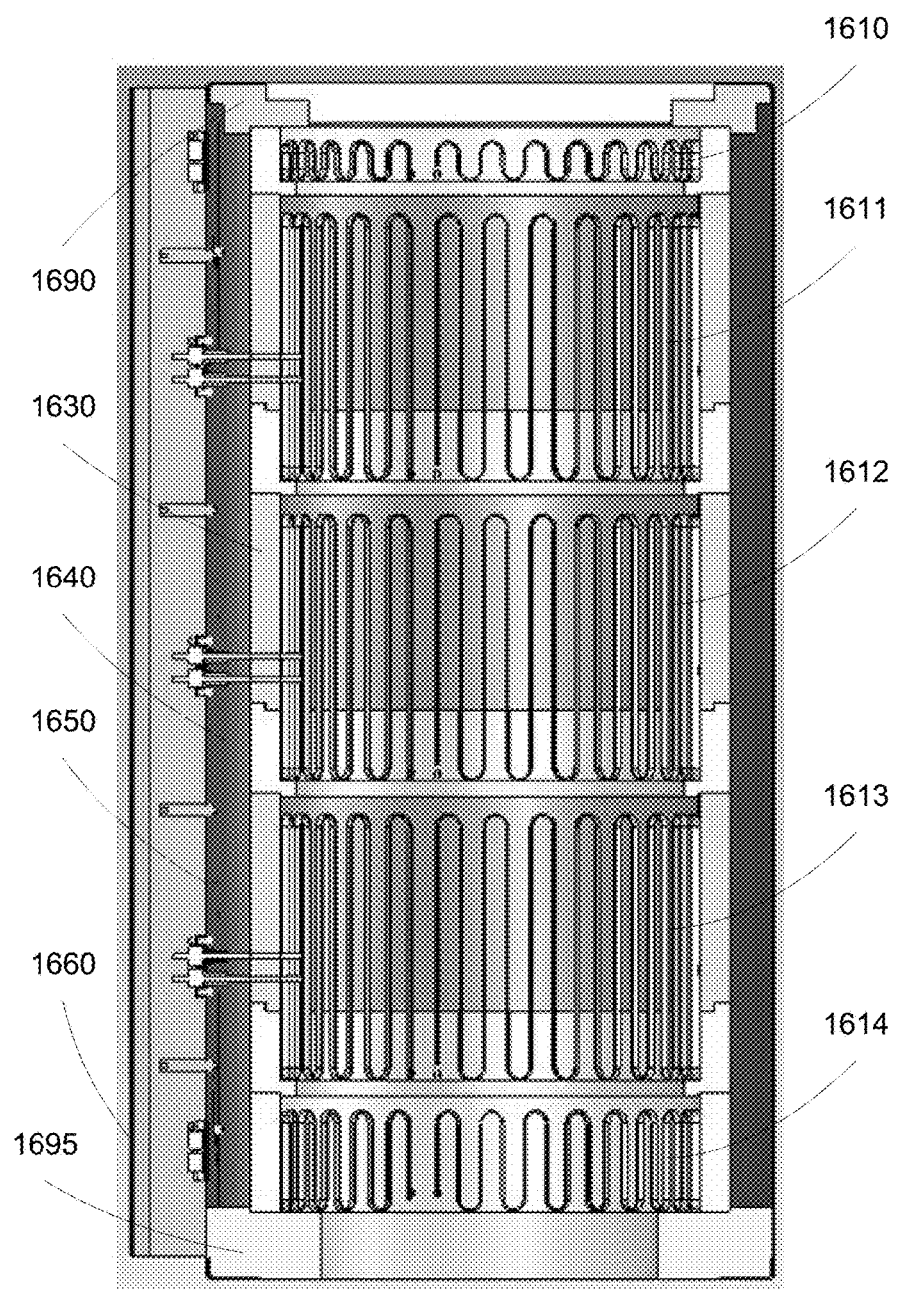
FIG. 16 illustrates a modular heater according to some embodiments of the present invention.

FIG. 16 illustrates a modular heater according to some embodiments of the present invention. Five heater modules 1610, 1611, 1612, 1613, and 1614 can be assembled together to form a large heater module. The heater modules can include an insulation layer 1630. The heater modules 1610-1614 can be mechanically attached to each other, for example, by the top vestibule 1690 and the bottom vestibule 1695 pressing on the insulation layers 1630 of the heater modules. The vestibules 1690 and 1695 can be supported by the external shell 1650, which can form a cover for the modular heater. The external shell 1650 and the insulation layers 1630 can form a channel 1640 surrounding the heater modules. Inlet and outlet openings can be included for providing flow, such as convection flow, to the channel 1640. A plenum can be included to provide forced flow to the channel (see the co-pending application "Heater elements with enhanced cooling"). A cover 1660 can be included to protect the external electrical contacts.

In some embodiments, the present invention discloses vertical furnaces and horizontal furnaces which can employ the modular heater. Modular heaters having a horizontal configuration provide substantially the same benefits as modular heaters having a vertical configuration. Horizontal modular heaters would be employed in horizontal furnaces as would typically be utilized in semiconductor and solar panel manufacture.

What is claimed is:

1. A furnace, comprising:
a quartz tube;
a plurality of heater modules surrounding the quartz tube, wherein each heater module comprises
a layer of insulation material,
wherein the layer of insulation material has a first surface, a second surface opposite the first surface, and a third surface connecting the first and second surfaces;
a heater element,
wherein the heater element is coupled to the first surface of the layer of insulation material,
wherein the layer of insulation material is configured to insulate the heater element from an outside ambient;
external connections electrically connected to the heater element,
wherein the external connections protrude to outside of the second surface;
one or more tongue or groove structures,
wherein the one or more tongue or groove structures are disposed on the third surface of the insulation layer,
wherein the tongue or groove structures are configured to mate with an adjacent heater module having corresponding tongue or groove structures;
one or more soft seals, wherein the soft seals a disposed on a surface of the tongue or groove structures,
wherein the heating capacity of the heater element in an outermost heater module is higher than that of the heater elements in a middle heater module, and wherein increasing the heating capacity comprises enlarging the strip or wire size for the heater elements in the heater modules.

2. A furnace as in claim 1, further comprising:

at least one of a plurality of channels disposed within only an outer portion of the insulation layer of a heater module, wherein the plurality of channels passes through along a length of the insulation layer, and an outer shell, wherein the outer shell forms a channel with an outer surface of the insulation layer of the heater module.

\* \* \* \* \*